United States Patent [19]

Fuller et al.

[11] Patent Number: 5,761,078
[45] Date of Patent: Jun. 2, 1998

[54] FIELD PROGRAMMABLE GATE ARRAYS USING SEMI-HARD MULTICELL MACROS

[75] Inventors: Christine Marie Fuller; Scott Whitney Gould; Steven Paul Hartman; Eric Ernest Millham; Gulsun Yasar, all of Chittenden, Vt.

[73] Assignee: International Business Machines Corporation, Armonk, N.Y.

[21] Appl. No.: 618,060

[22] Filed: Mar. 21, 1996

[51] Int. Cl.⁶ .................................................. G06F 17/50
[52] U.S. Cl. ................................. 364/489; 364/491
[58] Field of Search .............................. 364/488, 489, 364/490, 491

[56] References Cited

U.S. PATENT DOCUMENTS

| | | | |
|---|---|---|---|
| 4,636,965 | 1/1987 | Smith et al. | 364/491 |
| 4,768,154 | 8/1988 | Sliwkowski et al. | 364/468 |
| 4,858,143 | 8/1989 | Fournier | 364/491 |
| 5,225,991 | 7/1993 | Dougherty | 364/491 |
| 5,355,322 | 10/1994 | Yamashita et al. | 364/490 |
| 5,448,493 | 9/1995 | Topolewski et al. | 364/489 |
| 5,499,192 | 3/1996 | Knapp et al. | 364/489 |
| 5,521,835 | 5/1996 | Trimberger | 364/489 |
| 5,521,837 | 5/1996 | Frankle et al. | 364/489 |
| 5,526,276 | 6/1996 | Cox et al. | 364/489 |
| 5,553,001 | 9/1996 | Seidel et al. | 364/488 |
| 5,586,319 | 12/1996 | Bell | 395/701 |
| 5,594,657 | 1/1997 | Cantone et al. | 364/490 |
| 5,596,742 | 1/1997 | Agrawal et al. | 395/500 |
| 5,598,344 | 1/1997 | Dangelo et al. | 364/489 |

*Primary Examiner*—Emanuel Todd Voeltz
*Assistant Examiner*—Leigh Marie Garbowski
*Attorney, Agent, or Firm*—Whitham, Curtis & Whitham

[57] ABSTRACT

A computer implemented method for the automated placement and routing in the design of field programmable gate arrays achieves optimal timing. In a library of primitives and macros from which a designer may choose to implement a given circuit design, at least some of said macros are "semi-hard" macros where direct connections and relative placements are specified while local bus routing is requested in a manner that does not restrict macro placement. A logical netlist containing references to macros and how to connect them together to perform a logical function is first created. The logical netlist is then translated to a physical netlist using a mapper function. This physical netlist for the semi-hard macros specifies what is to be connected but not how. The best place to put each macro on the field programmable gate array is found using a placer function. The placer function thus determines an absolute position of the macros. Pre-defined macro direct connections are routed using a router function. The router function determines an optimal path to connect the semi-hard macros. Finally, a bitstream is generated from placement and routing information developed by the placer and router functions to program the field programmable gate array to perform the netlist logical function.

4 Claims, 5 Drawing Sheets

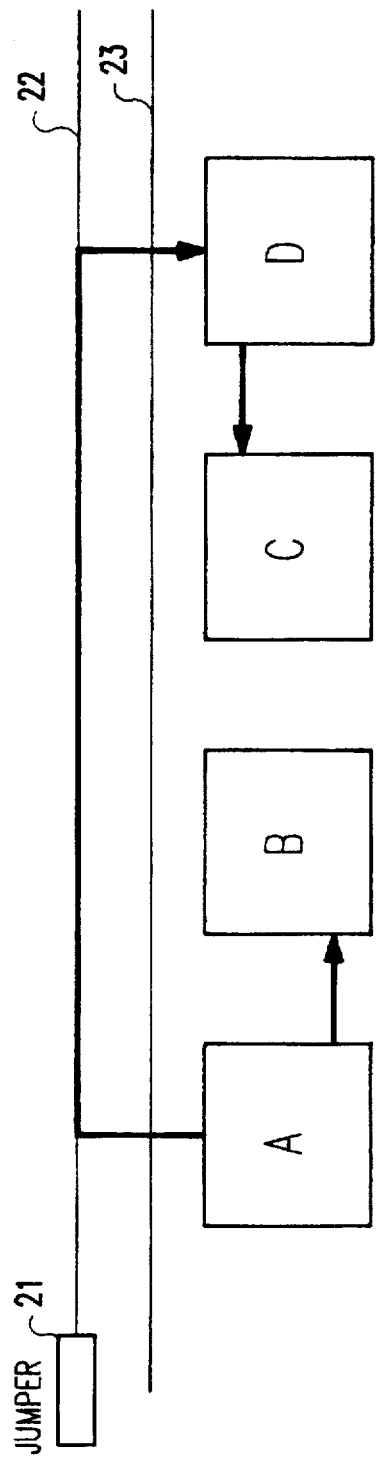
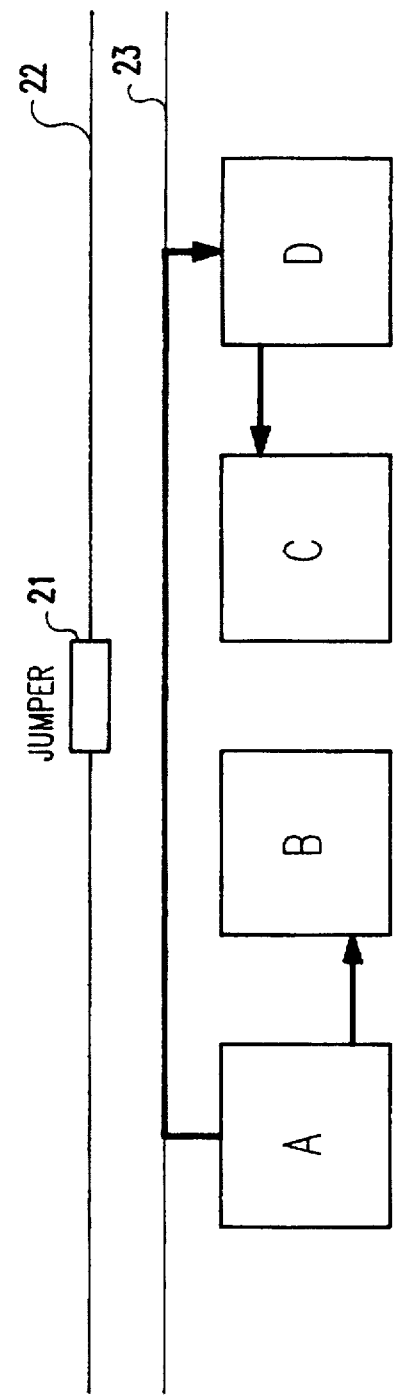
FIG.2A
FIG.2B

FIELD PROGRAMMABLE GATE ARRAYS USING SEMI-HARD MULTICELL MACROS

BACKGROUND OF THE INVENTION

1. Field of the Invention

The present invention generally relates to the design and manufacture of field programmable gate arrays (FPGAs) and, more particularly, to a method for automated placement and routing that optimizes macro timing without unnecessarily restricting macro placement and routing.

2. Background Description

In very large scale integrated (VLSI) circuit design, many thousands of transistors must be arranged in a limited space to provide some desired logic function. To assist designers, automated placement and routing (APR) software has been written. Such APR software typically includes a mapper, a placer and a router to produce a bitstream that is used to generate the wiring on the chip. In a cell-based physical design methodology, a library of primitives and macros is provided to the designer, each primitive containing a small group of transistors that together provide an elemental logical function, such as an AND gate, an OR gate, or the like, and each macro containing a small group of primitives which form a full adder, a counter stage, or the like. The logic designer uses these primitives and macros in constructing the overall circuit that implements a larger logical function.

For a given library of macros there is typically a preferred implementation for certain critical path portions of the overall circuit that provides the best performance, timing, density, low power or function. Such portions of the overall circuit are often prearranged into fixed macro blocks, rather than relying on the standard cell implementations.

In a field programmable gate array (FPGA), identical cells (e.g. core cells) are arranged on a chip in rows with a fixed amount of space between them reserved for interconnections. Each cell comprises a fixed number of unconnected transistors and a designer specifies the necessary connections among the transistors to implement the circuit.

The more transistors which make up each programmable cell, the more complex functions they can implement, however these cells require more silicon area and therefore a fewer number can exist in the overall array. Cells which can implement less function usually require less silicon array and can exist in a much larger array. Programmable gate arrays having a relatively large number of core cells are defined as fine grain architectures whereas the larger cells (yet smaller arrays) are defined as coarse grain architectures. In fine grain architectures the space between cells of the array reserved for interconnection becomes quite complex and cumbersome due to the larger number of cells whose connections must be supported. For this reason, the routing structure is usually comprised of large amounts of direct and nondirect bussing which often lead to larger interconnect propagation delays. Special attention must therefore be given to finding ways to reduce interconnect delay in fine grain architecture as much as possible in order to attain high performance results.

FPGA's also use a cell or macro library. Automated placement and routing software for FPGA's offer significant time savings over the custom design of equivalent circuits. Typically, such methodologies trade design time for the efficient use of the silicon real estate of the chip.

A "hard" macro includes specification of both placement and interconnect routing for maximum performance. However, hard macro design is not always the best choice for optimal performance. A hard macro does not use non-direct bussing (local busses) for any internal connections between core cells and the relative placement, and routing of core cells is fixed. By using hard macros, very often core cells are wasted when being implemented as busses (thereby providing no logical function). If local busses were to be used and predefined, a specific local bus may be chosen which constrains the routing tool and may result in slower implementation.

When creating multi-cell macros, it sometimes is necessary to use local busses to connect cells within the macro. Many local busses may exist for the macro designer to choose from. These busses have different lengths and core cell connectivity. At the time of macro design it is not possible to ensure the correct bus is being used as the bus choice is dependent on where the macro is physically placed on the FPGA.

In some macros, optimal performance may only be achieved by allowing the routing tool to choose the best local bus for a particular internal connection for a given placement of the macro.

Among other things, the attractiveness of an FPGA is based upon how much logic you can get out of it as well as how fast your can get it to run. Since an FPGA is made up of an array of configurable logic elements surrounded by a finite number of routing resources, it is always beneficial to use as much of the core cells for logic functions, as opposed to wiring.

Hard macros can at times have disadvantages due to their fixed shapes. When a larger macro must be "crushed" or broken down into smaller primitives in order for it to be placed, it is referred to as a "soft" macro. When this occurs however, performance is degraded since the original dense placement and direct connections of the multi-celled macro must now be routed using extraneous nondirect (and therefore slower) routing structures. In a fine grain FPGA architecture, where every precaution must be made to eliminate unnecessary interconnect delay, the use of soft macros is often unacceptable and therefore typically not included in libraries. What is needed therefore is the flexibility in placement and wiring connectivity afforded by soft macros with the performance provided by hard macros in the design of FPGAs to achieve optimum density and performance of a given circuit design.

SUMMARY OF THE INVENTION

It is therefore an object of the present invention to provide a "semi-hard" macro where direct connections and relative placements are specified, while local bus routing is requested in a manner that does not restrict macro placement.

It is another object of this invention to allow more efficient routing and use of cells in the automated placement and routing of macros in field programmable gate arrays (FPGAs).

The invention provides definition of a "semi-hard" macro in an FPGA system where direct connections and relative placements are defined, but non-direct (local bus) connections are left to the discretion of the APR software.

To define a semi-hard macro, the invention comprises a computer implemented method in which a library of primitives and macros, including some semi-hard macros, from which a designer may choose to implement a given circuit design is provided. The computer implemented method then creates a logical netlist which contains references to macros and how to connect them together to perform a logical function. The logical netlist is translated to a physical netlist using a mapper function. This physical netlist specifies what is to be connected but not how. The best place to put each macro on the field programmable gate array is found using a placer function, thereby determining an absolute position of the macros. Pre-defined macro direct connections are then routed using a router function. This router function determines an optimal path to connect internal semi-hard macro wiring. Finally, the computer implemented method generates a bitstream from placement and routing information developed by the placer and router functions to program the field programmable gate array to perform the netlist logical function.

The FPGA library according to the present invention consists of primitives, or single core cell functions, and macros, or multiple core cell functions. Macros are further subdivided into "hard" and "semi-hard". Up until this invention, primitives and hard macros were the only two options provided to the FPGA user when implementing their design. Hard macros are logic functions made up of two or more primitives and contain predefined or fixed routing consisting of either direct connects or wire thru cells (core cells used as a wiring resource).

Both primitives and macros are attractive to the user since they have a fixed delay that is independent of placement, and can be found in the data book specifications. The macros however, presents a slight disadvantage in that very often core cells are wasted being used as interconnecting resource as well as producing less than optimal macro performance (slower than using a local bus).

Semi-hard macros free up wasted core cells used as wiring in macros. The source and destination points in the macro are left unconnected, rather than connected thru a core cell, until the placement phase of APR software is complete and routing begins. The user will be able to choose between routing all semi-hard macro unconnected nets first and locking or allowing the timing driven router to treat the unconnected macro nets as any other net and route the entire design with the overall design performance goal as the objective.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A and 2B shows two local bus alternatives for a 4-cell macro;

DETAILED DESCRIPTION OF A PREFERRED EMBODIMENT OF THE INVENTION

Figure 1:
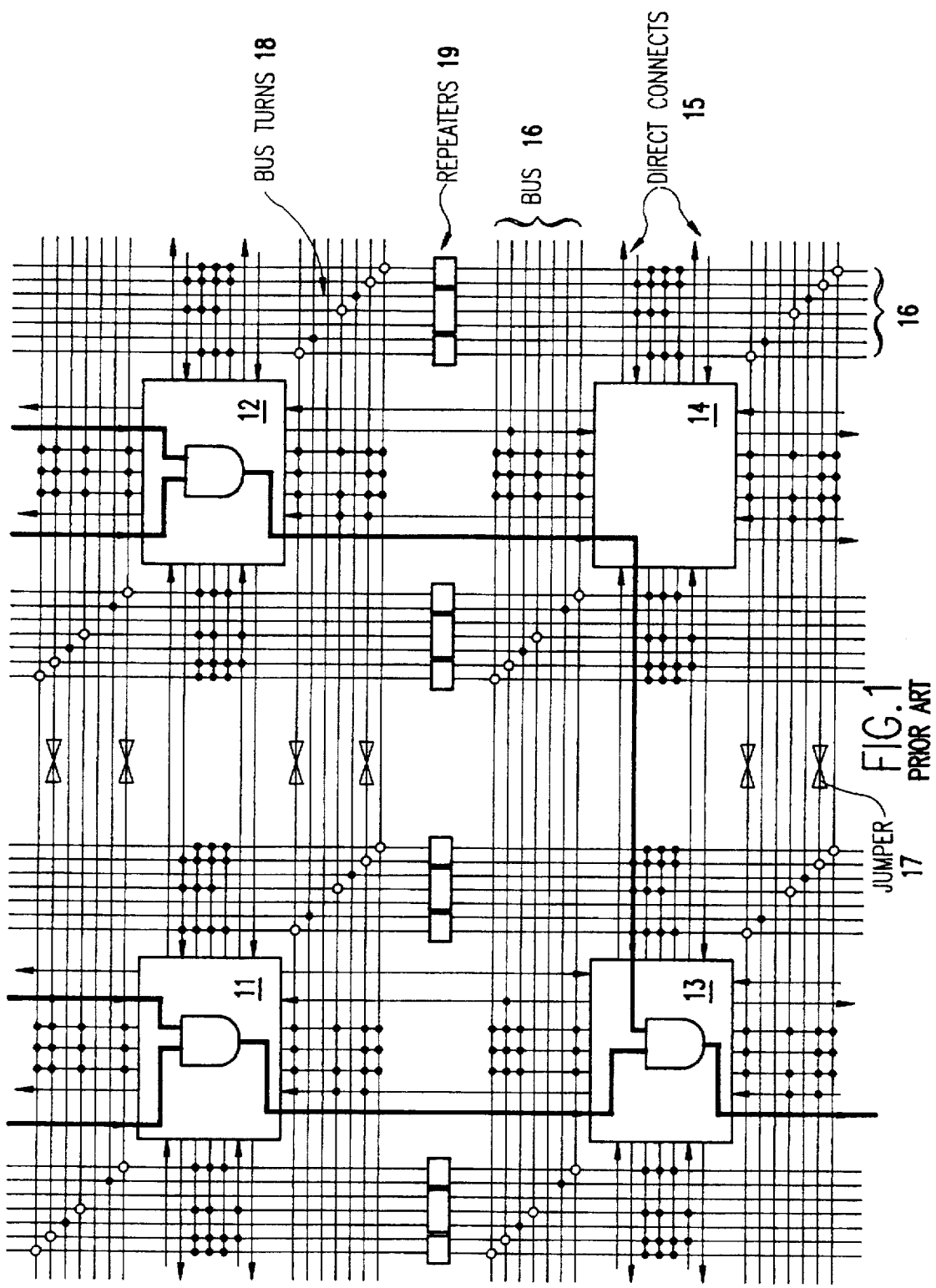
FIG. 1 is a schematic of a portion of an FPGA using conventional hard macros.

Referring now to the drawings, and more particularly to FIG. 1, there is shown a schematic of a portion of an FPGA using a hard macro. This macro of the FPGA comprises four cells, 11, 12, 13, and 14. Between them is a wiring structure 10 made up of fast direct connects 15 and buses 16, the latter of which span the entire chip. Bus segments are connected by jumpers 17, bus turns 18 and repeaters 19. The repeaters provide a redrive capability to enhance performance, whereas the jumpers and bus turns do not.

FIGS. 2A and 2B show a four-cell macro with two local bus alternatives. The FPGA routing resource structure is comprised of buffered and unbuffered elements. Unbuffered elements, such as the jumper 21, are undesirable for performance improvements since they degrade and slow down signals which pass through them. Therefore, it would be beneficial to avoid using a jumper if possible. As illustrated in FIGS. 2A and 2B, the program is able to route around a jumper, increasing performance. If placement of the macro occurs such that the jumper 21 is located as shown in FIG. 2A, then bus 22 should ideally be used. If placement of the macro occurs such that the jumper 21 is located as shown in FIG. 2B, then bus 23 should ideally be used. For maximum performance, the placement and router software must be free to choose any location, orientation, or rotation of the macro itself.

If the routing resources of the wiring structure were to be listed in a preferred order based on performance, as biased by the APR tools, the list would be as follows:

direct connects (fastest)
  local buses
  local buses with repeaters
  local buses with jumpers
  wire throughs (although a logic function is sacrificed)
  local buses with a series of bus turns (slowest)

Returning to FIG. 1, the cells 11, 12 and 13 are assumed for this example to be AND gates. Prior to the present invention, FPGA libraries consisted of primitives and hard macros. Hard macros are logic functions made up of two or more primitives and contain predefined (fixed) routing resources consisting of either direct connects or wire through cells (i.e., core cells used as a wiring resource). Both are attractive to the designer since they have a fixed delay that is independent of placement and can be found in the data book specifications. The macros, however, presented a slight disadvantage because very often core cells were wasted being used as an interconnecting resource as well as producing less than optimal macro performance (i.e., slower than using a local bus). As can be seen from the example of FIG. 1, routing from AND gates 11 and 12 both go to AND gate 13; however, the connection used between AND gates 12 and 13 goes through a cell 14. That is, the logic function of cell 14 is sacrificed to facilitate the wiring connection from macro 12 to macro 13. This wastes logic resources.

This invention creates "semi-hard" macros. In a semi-hard macro, direct connections and relative placements are specified, while local bus routing is specified only as a request, such as connect macro block A to macro block D, without specifying how. The automated placement and router program defaults to routing semi-hard nets before other interconnects, thus ensuring the optimal performance for each macro independent of location. All possible placements and routings can be predetermined, and a timing range for the macro provided. This achieves the goal of a known timing, as in a hard macro, and of always choosing the best timing available with no unnecessarily restricting macro placement.

Figure 3:
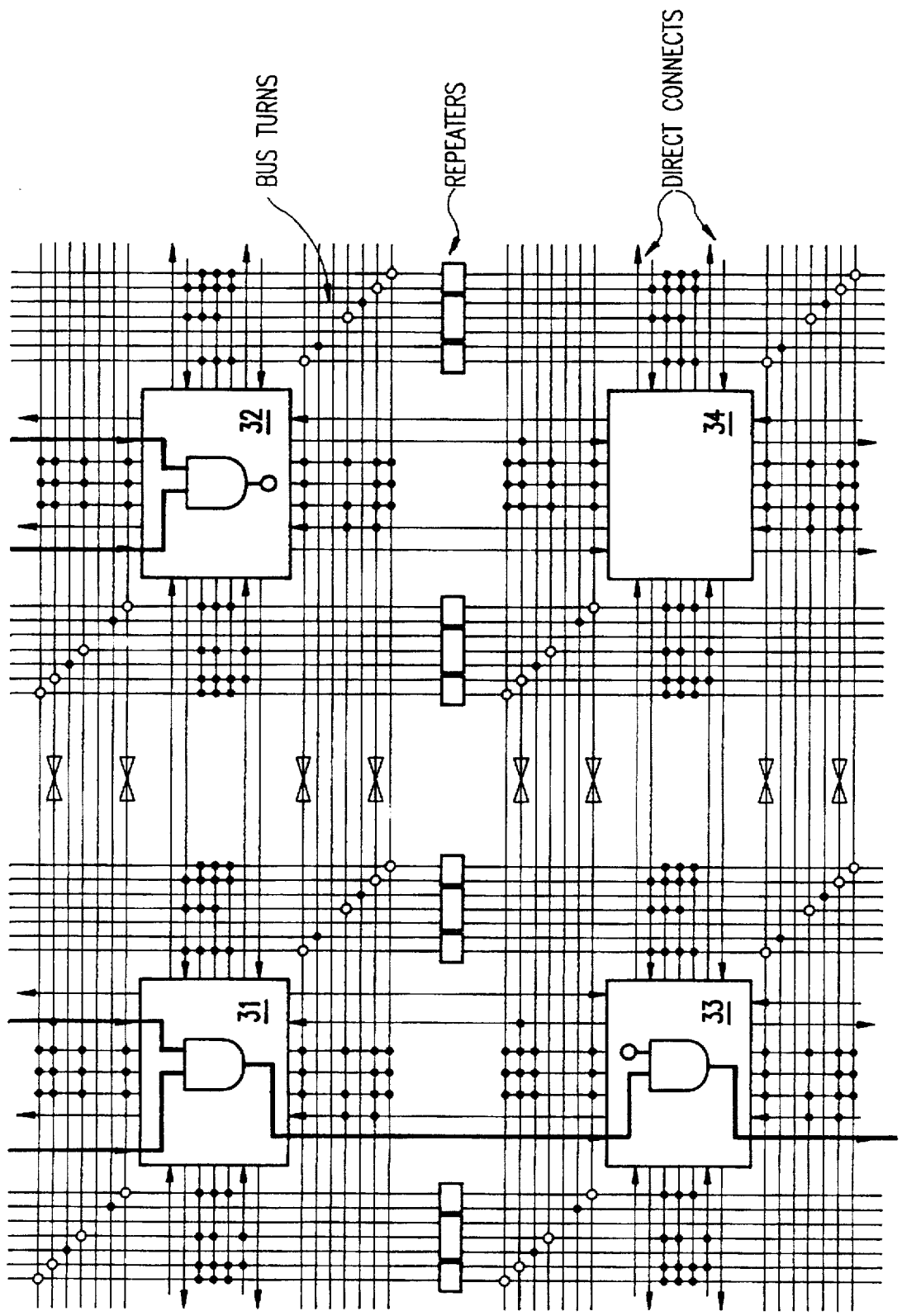
FIG. 3 is a schematic of an FPGA using semi-hard macros according to the present invention.
Figure 4:
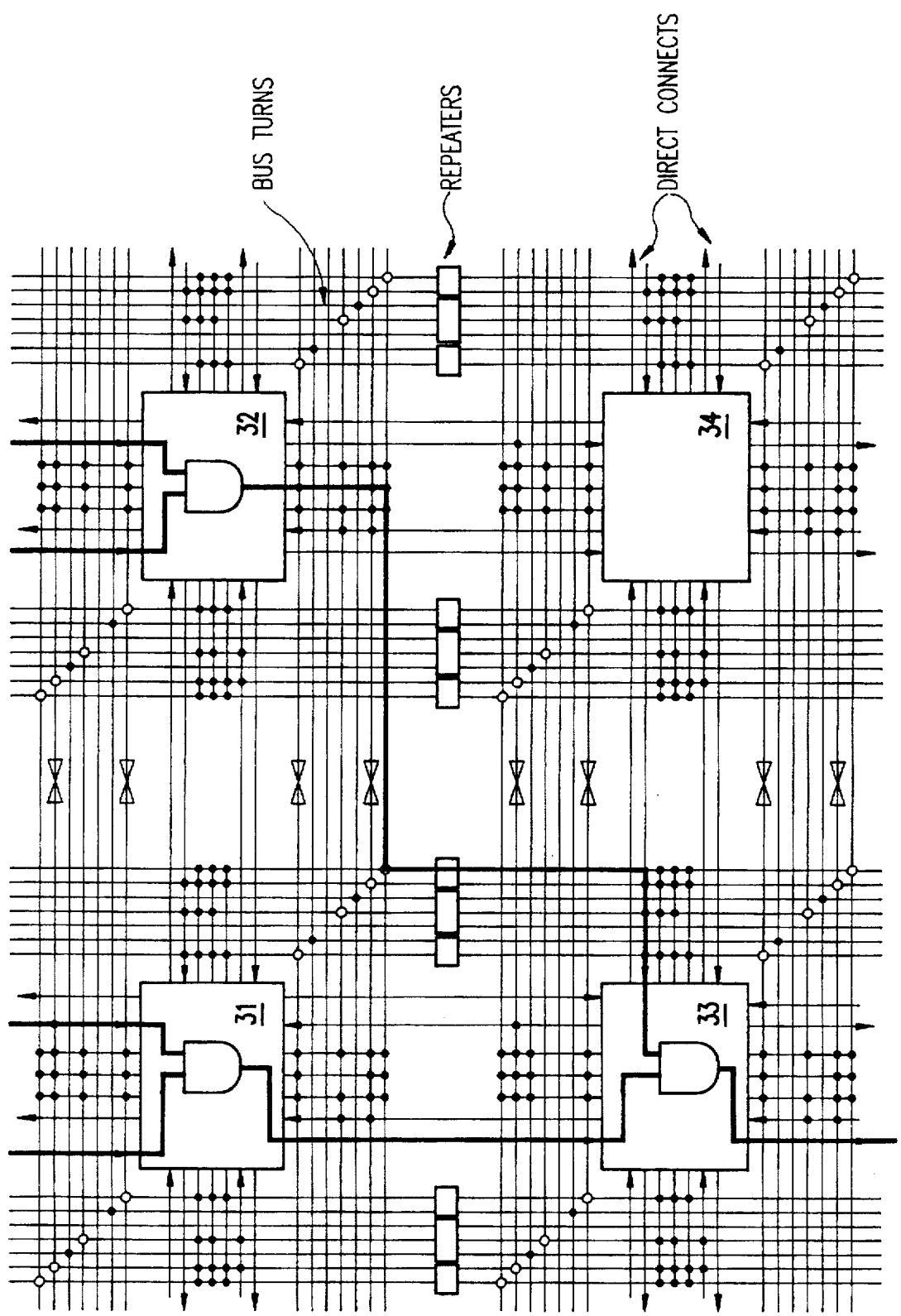
FIG. 4 is a schematic of the FPGA of FIG. 2 after routing according to the present invention.

FIG. 3 shows an example of a semi-hard macro before routing. For the sake of consistency with the example of FIG. 1, there are four cells, 31, 32, 33 and 34, and cells 31, 32 and 33 are again assumed to be AND gates. Note here that the output of AND gate 32 is not yet connected to the input of AND gate 33. During routing mode, the router software has the option to route the net from the output of gate 32 to the input of gate 33 using whichever resources result in an optimum performance. FIG. 4 illustrates that upon completion of the routing mode, the APR software has selected to use the illustrated path since it resulted in the best performance, although this path includes both a repeater and a bus turn.

The use of semi-hard macros provides significant performance improvements. Semi-hard macros specify direct connections and relative placements and request local bus routing such that the automated placement and router program can define optimal connections which will result in the best time. Therefore, FPGA macros relative placement is pre-specified, but the interconnect routing is not determined until the routing phase.

Figure 5:
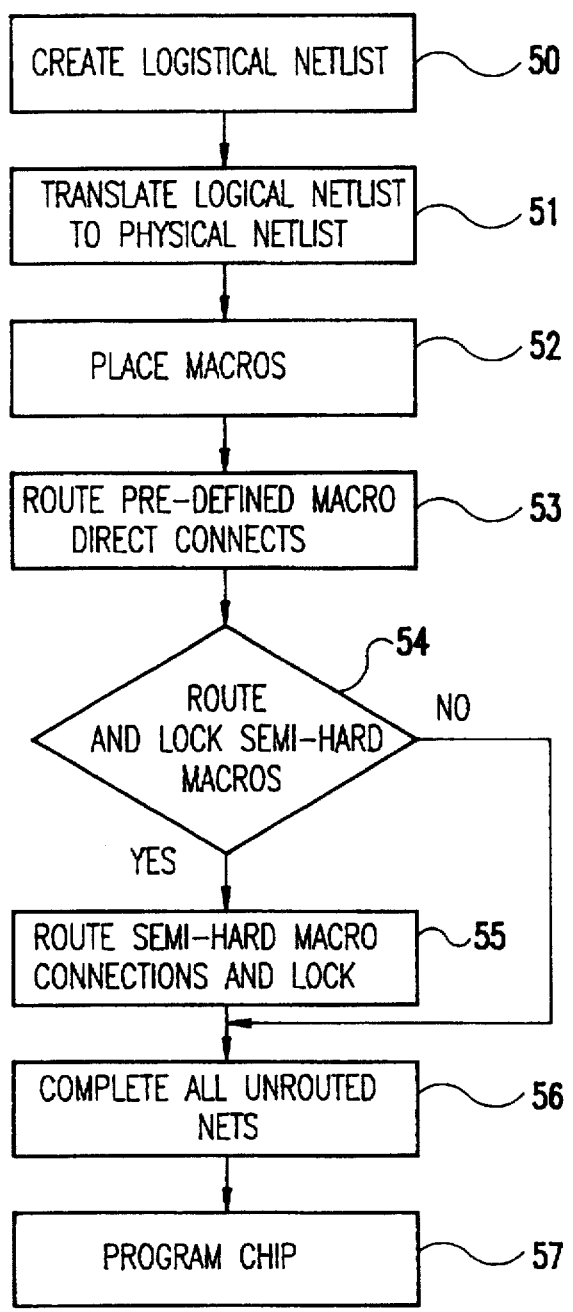
FIG. 5 is a flow chart showing the path of the overall process of the invention.

In FIG. 5, a flow chart showing the steps of the invention is shown. First, in block 50, a logical netlist is created. The logical netlist contains references to macros along with how to connect them together. A macro may contain many individual primitive cells. At this time, the cell's contents or connections are not known.

After the logical netlist is created, the next step in block 51 is for the mapper of the APR software to take the logical netlist and change it to a physical netlist. At this time, the macro contents are known. The mapper uses the macro library file which references each logical macro to its physical representation. The physical macros which contain more than one cell also specify how these cells should be placed on the FPGA relative to each other. No absolute coordinates for macros or their elements are supplied. The physical macros may also contain complete instructions on how to wire the macro elements to each other or in the case of a semi-hard macro the instructions say what to connect but not how.

In block 52, placement of the macro occurs. The placer of the APR software finds the best place to put each macro on the FPGA. This is the absolute position of the macro. The placer of the APR software at that time places each macro element per the pre-specified relative placement.

In blocks 53 to 57, the router of the APR software finds the best way to connect macros. In the case of a hard macro, the router of the APR software honors the directions pre-specified on how to connect macro elements. In a semi-hard macro, the router software determines the optimal path to connect macro elements. In block 53, predefined routing of direct connects is done.

Next, in block 54, a decision step, the user will decide whether to set the semi-hard macro. If "yes", then the semi-hard macro is routed and connections are locked as shown in block 55. Following locking of connections, the program proceeds to block 56, where any remaining unrouted nets are completed. If the user's decision in block 54 is "no", then all unrouted nets are treated the same, and the program proceeds to the step shown in block 56 where all unrouted nets are completed.

Finally, in Block 57, the bitstream takes the placement and routing information and uses it to program the chip to perform the logical netlist function.

The user who has spent a considerable amount of time hand placing their design may choose to route all semi-hard macro unconnected macros first and lock their routing to ensure optimal performance of the critically placed semi-hard macros. On the other hand, a user may want the placer and router software to do everything for them automatically thereby allowing the router software to route each semi-hard macro with the timing driven goal of the overall design. For example, there is no need to have a counter macro which can run at 50 MHZ to necessarily be routed to achieve this timing when the design only calls for the counter to run at 30 MHZ. By routing the counter to run at 50 MHZ, critical bussing resources may have been used which resulted in an unsuccessful routing job where the overall design did not even meet its 30 MHZ target.

Either option provides the router software the flexibility of choosing the appropriate routing scenario for each semi-hard macro depending upon the timing constraint in which it is used. Although semi-hard macros do not provide the user with "fixed" data book delay characteristics, they will greatly increase the chances of their design being placed and routed successfully while achieving all performance goals.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method for automated placement and routing of field programmable gate arrays to achieve optimal timing, comprising the steps of:

providing a library of primitives and macros from which a designer can implement a given circuit design, at least some of said macros being semi-hard macros where direct connections and relative placements are specified while local bus routing is requested in a manner that does not restrict macro placement;

creating a logical netlist which contains references to macros and how to connect said macros together to perform a logical function;

translating the logical netlist to a physical netlist using a mapper function, the physical netlist for semi-hard macros specifying what is to be connected but not how;

finding a best place to put each macro on the field programmable gate array using a placer function, thereby determining an absolute position of the macros;

routing direct connections between said macros using a router function, said router function determining an optimal path to connect internal semi-hard macro wiring; and generating a bitstream from placement and routing information developed by the placer and router functions to program the field programmable gate array to perform the netlist logical function.

2. The computer implemented method for the automated placement and routing of field programmable gate arrays recited in claim 1 further comprising the steps of:

providing the designer with an option to route and lock semi-hard macros using said router function; and permitting the designer to route semi-hard macros to ensure optimal performance said semi-hard macros.

3. A program storage device readable by a machine, tangibly embodying a program of instructions executable by said machine to perform a series of method steps for automated placement and routing of field programmable gate arrays, said method steps comprising:

providing a library of primitives and macros from which a designer can implement a given circuit design, at least some of said macros being semi-hard macros where direct connections and relative placements are specified while local bus routing is requested in a manner that does not restrict macro placement;

creating a logical netlist which contains references to macros and how to connect said macros together to perform a logical function;

translating the logical netlist to a physical netlist using a mapper function, the physical netlist for semi-hard macros specifying what is to be connected but not how;

finding a best place to put each macro on the field programmable gate array using a placer function, thereby determining an absolute position of the macros;

routing direct connections between said macros using a router function, said router function determining an optimal path to connect internal semi-hard macro wiring; and generating a bitstream from placement and routing information developed by the placer and router functions to program the field programmable gate array to perform the netlist logical function.

4. A program storage device readable by machine as in claim 3, wherein said method further comprises the steps of:

providing the designer with an option to route and lock semi-hard macros using said router function; and permitting the designer to route semi-hard macros to ensure optimal performance of said semi-hard macros.

* * * * *